US006753559B2

United States Patent
Chatterjee et al.

(10) Patent No.: US 6,753,559 B2
(45) Date of Patent: Jun. 22, 2004

(54) TRANSISTOR HAVING IMPROVED GATE STRUCTURE

(75) Inventors: Amitava Chatterjee, Plano, TX (US); Wei William Lee, Plano, TX (US); Greg A. Hames, Dallas, TX (US); Qizhi He, Plano, TX (US); Maureen Hanratty, Dallas, TX (US); Iqbal Ali, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/899,199

(22) Filed: Jul. 6, 2001

(65) Prior Publication Data

US 2001/0046760 A1 Nov. 29, 2001

Related U.S. Application Data

(62) Division of application No. 09/225,405, filed on Jan. 5, 1999.
(60) Provisional application No. 60/071,132, filed on Jan. 12, 1998.

(51) Int. Cl.⁷ .................. H01L 29/80; H01L 31/112
(52) U.S. Cl. .................. 257/283; 438/182; 438/183; 257/284; 257/330
(58) Field of Search ................. 257/412, 283–284, 257/330–334, 288; 438/182–183

(56) References Cited

U.S. PATENT DOCUMENTS

| | | | | |
|---|---|---|---|---|
| 4,717,681 A | * | 1/1988 | Curran | 438/314 |
| 4,901,133 A | * | 2/1990 | Curran et al. | 257/637 |
| 5,236,862 A | * | 8/1993 | Pfiester et al. | 438/439 |
| 5,369,052 A | * | 11/1994 | Kenkare et al. | 438/439 |
| 5,688,704 A | * | 11/1997 | Liu | 257/288 |
| 5,789,315 A | * | 8/1998 | Besser et al. | 438/624 |
| 5,824,587 A | * | 10/1998 | Krivokapic | 438/300 |
| 5,856,225 A | | 1/1999 | Lee et al. | 438/291 |
| 5,937,302 A | | 8/1999 | Gardner et al. | 438/305 |
| 5,960,270 A | * | 9/1999 | Misra et al. | 438/197 |
| 5,976,924 A | * | 11/1999 | Gardner et al. | 438/230 |
| 5,994,179 A | | 11/1999 | Masuoka | 438/227 |
| 5,998,285 A | | 12/1999 | Chou | 438/585 |
| 6,051,486 A | * | 4/2000 | Gardner | 438/585 |
| 6,063,675 A | | 5/2000 | Rodder | 438/300 |
| 6,063,677 A | | 5/2000 | Rodder et al. | 438/300 |
| 6,121,133 A | * | 9/2000 | Iyer et al. | 438/636 |

* cited by examiner

*Primary Examiner*—Long Pham
*Assistant Examiner*—Thao X. Le
(74) *Attorney, Agent, or Firm*—Wade James Brady III; Frederick J. Telecky, Jr.

(57) ABSTRACT

A gate structure which includes a semiconductor substrate having a channel region, a gate insulator adjacent the channel region of the semiconductor substrate and a conductible gate adjacent the gate insulator. A primary insulation layer is adjacent the semiconductor substrate, the primary insulation layer having an opening where the gate insulator contacts the semiconductor substrate and an isolation dielectric layer adjacent the primary insulation layer, the isolation dielectric layer having an opening where the conductible gate is located and the isolation dielectric layer having a silicon oxynitride material.

10 Claims, 1 Drawing Sheet

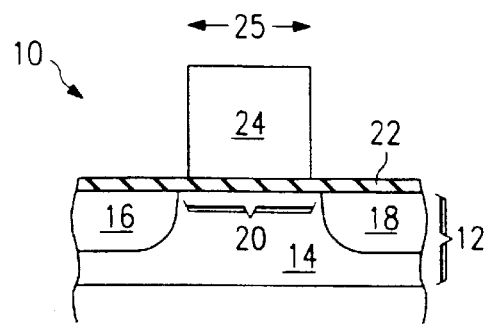
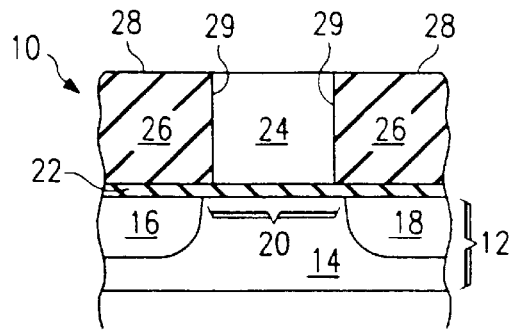
FIG. 1A   FIG. 1B
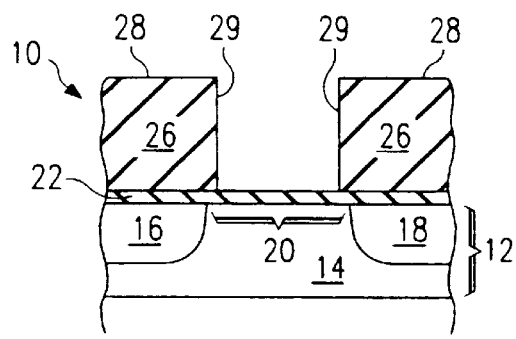
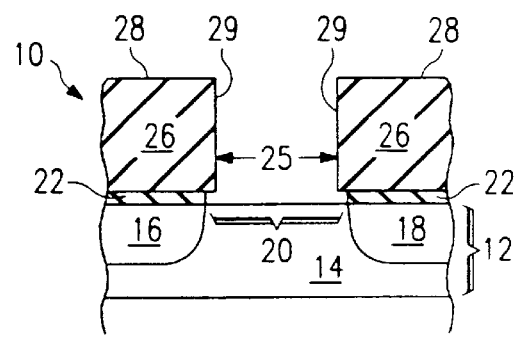
FIG. 1C   FIG. 1D
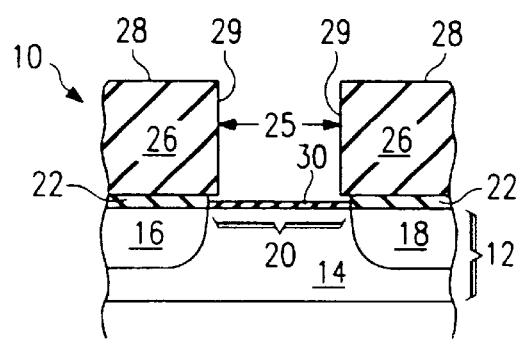
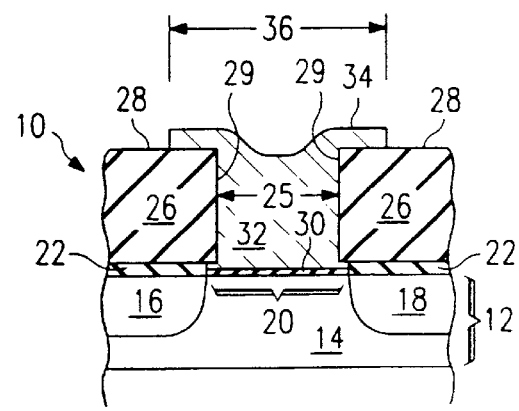
FIG. 1E   FIG. 1F

TRANSISTOR HAVING IMPROVED GATE STRUCTURE

This application is a division of Ser. No. 09/225,405, filed Jan. 5, 1999 which claims priority under 35 U.S.C. 119 from provisional application Serial No. 60/071,132, filed Jan. 12, 1998.

TECHNICAL FIELD OF THE INVENTION

This invention relates generally to the field of electronic devices, and more particularly to a transistor having an improved gate structure and method of construction.

BACKGROUND OF THE INVENTION

Electronic equipment such as televisions, telephones, radios, and computers are often constructed using semiconductor components, such as integrated circuits, memory chips, and the like. The semiconductor components are constructed from various microelectronic devices, such as transistors, capacitors, diodes, resistors, and the like. These microelectronic devices, and in particular the transistor, may be formed on a semiconductor substrate.

A transistor generally includes a gate formed on the semiconductor substrate that operates to control the flow of current through the transistor. The dimensions of the gate are carefully controlled to precisely control the flow of current through the transistor and to prevent leakage or shorting in the transistor. One such dimension that is carefully controlled is the width of the gate. Some gate fabrication techniques construct side wall bodies during the gate fabrication process to control the width of the gate and to aid in constructing the source and drain regions of the microelectronic device. The use of side wall bodies will typically increase the complexity, fabrication time, and cost of the transistor and the corresponding semiconductor components.

Some gate fabrication techniques may also utilize an etching process, such as plasma etching or wet chemical etching, to chemically remove material to form and pattern the transistor. The etching processes used in some gate fabrication processes can remove material that would otherwise be beneficial to the construction or operation of the gate. The loss of the beneficial material during these etching processes may reduce the manufacturability or operating ability of the gate, transistor, and the semiconductor component.

SUMMARY OF THE INVENTION

Accordingly, a need has arisen for a transistor having an improved gate structure and method of construction. The present invention provides a transistor having an improved gate structure and method of construction that substantially eliminates or reduces disadvantages and deficiencies associated with prior devices and methods.

In accordance with one embodiment of the present invention, an improved gate structure of a transistor may be fabricated by forming a primary insulation layer adjacent a substrate. The primary insulation layer is comprised of a first material. A disposable gate is then formed outwardly from the primary insulation layer. An isolation dielectric layer is then formed outwardly from the primary insulation layer. The isolation dielectric layer is comprised of a second material, wherein the second material is different than the first material. The disposable gate is removed to expose a portion of the primary insulation layer. The exposed portion of the primary insulation layer is then removed to expose a portion of the substrate. The primary insulation layer is selectively removable relative to the isolation dielectric layer by using an etch that is selective to the first material relative to the second material. A gate insulator is then formed on the exposed portion of the substrate, and a gate is then formed adjacent the gate insulator. In a particular embodiment, the gate has a T-gate configuration.

In accordance with another embodiment of the present invention, a method of fabricating a semiconductor component comprises the steps of: forming a primary insulation layer adjacent a semiconductor substrate; forming a disposable gate adjacent the primary insulation layer; forming a silicon oxynitride layer over the primary insulation layer and the disposable gate, said layer having a depth which is greater than a depth of the disposable gate; removing an upper portion of the silicon oxynitride layer which lies higher than the disposable gate, such that at least a portion of the disposable gate is exposed; removing the disposable gate to expose a portion of the primary insulation layer, the disposable gate being selectively removable relative to the silicon oxynitride layer; removing the exposed portion of the primary insulation layer to expose a portion of the semiconductor substrate, the primary insulation layer being selectively removable relative to the silicon oxynitride layer; forming a gate insulator adjacent the exposed portion of the semiconductor substrate; and forming a gate adjacent the gate insulator.

In accordance with another embodiment of the present invention, a gate structure comprises: a semiconductor substrate having a channel region; a gate insulator adjacent the channel region of the semiconductor substrate; a conductible gate adjacent the gate insulator; a primary insulation layer adjacent the semiconductor substrate, said primary insulation layer having an opening where the gate insulator contacts the semiconductor substrate; and an isolation dielectric layer adjacent the primary insulation layer, said isolation dielectric layer having an opening where the conductible gate is located, and said isolation dielectric layer comprising a silicon oxynitride material.

Important technical advantages of the present invention include providing an improved gate structure in which the isolation dielectric layer is not substantially removed during the disposable gate removal process or the primary insulation layer removal process. Thus, an adequate distance between the gate and the conducting source and drain regions of the transistor is maintained. Accordingly, the transistor will have an increased resistance to charge leakage and shorting between the gate and the source or drain regions. Additionally, the gate to drain capacitance and the gate to source capacitance are not significantly increased during the removal of the disposable gate and the oxide layer underlying said gate.

Another technical advantage of the present invention includes providing an improved gate structure that does not require a sidewall body during manufacturing. The sidewall bodies associated with some gate structures can form ear-like structures that extend above the surface of the isolation dielectric layer due to the removal of the isolation dielectric layer after the sidewall body is formed. These ear-like structures may be fragile and lead to problems in later fabrication processes, such as the formation of a T-gate structure. In particular, a T-gate configuration may be prone to damage due to the ear-like structure associated with the sidewall bodies.

A further technical advantage of the present invention is that the process of fabricating the improved gate structure includes fewer fabrication operations. Accordingly, the improved gate structure may be less expensive to fabricate than some gate structures.

Other technical advantages will be readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which:

FIGS. 1A through 1F are a series of cross-sectional diagrams illustrating the fabrication of a transistor having an improved gate structure in accordance with the present invention.

DETAILED DESCRIPTION OF THE INVENTION

The preferred embodiment of the present invention and its advantages are best understood by referring to FIGS. 1A through 1F of the drawings, like numerals being used for like and corresponding parts of the various drawings.

FIGS. 1A through 1F illustrate the fabrication of a transistor having an improved gate structure. As described in more detail below, the improved gate structure is fabricated using an isolation dielectric layer material that is not substantially etched when either the disposable gate or the primary insulation layer is being etched. Thus, the width of the gate eventually formed is not increased and the isolation dielectric layer is not substantially reduced in thickness during the improved gate fabrication process.

FIG. 1A illustrates an initial semiconductor structure 10 having a substrate 12 that may comprise a wafer 14 formed from a single-crystalline silicon material. It will be understood that the substrate 12 may comprise other suitable materials or layers without departing from the scope of the present invention. For example, the substrate 12 may include an epitaxial layer, a recrystallized semiconductor material, a polycrystalline semiconductor material, or any other suitable semiconductor material.

The substrate 12 comprises a first doped region 16 and a second doped region 18 separated by a channel region 20. Doped regions 16 and 18 comprise portions of the substrate 12 into which impurities have been introduced to form a conductive region. The doped regions 16 and 18 may be formed by implantation of impurities into the substrate 12 or by other conventional doping processes. Though doped regions 16 and 18 are shown in FIGS. 1A–1F as stopping just short of channel region 20, one skilled in the art will appreciate that doped regions 16 and 18 may overlap with channel region 20.

A primary insulation layer 22 is formed outwardly from the substrate 12. The thickness of the primary insulation layer 22 is on the order of 100 Å to 500 Å. In one embodiment, the primary insulation layer 22 comprises silicon dioxide. In another embodiment, the primary insulation layer 22 comprises silicon nitride. It will be understood that the primary insulation layer 22 may comprise other materials suitable for insulating semiconductor elements.

A disposable gate 24 is formed outwardly from the channel region 20 of the substrate 12 with a portion of the primary insulation layer 22 disposed between the disposable gate 24 and the substrate 12. A slot width 25 is associated with the disposable gate 24. The slot width 25 and the thickness of the disposable gate 24 are on the order of 0.1 and 0.2 microns, respectively. As described in greater detail below, the disposable gate 24 is disposable in that it is subsequently removed during the fabrication process. The disposable gate 24 is formed using conventional photolithographic and selective etching processes. For example, a layer of gate material may be formed, which layer is subsequently patterned and etched to form disposable gate 24. During the etching process to form disposable gate 24, primary insulation layer 22 may also be etched such that only a fraction of primary insulation layer 22 remains after the formation of disposable gate 24.

The disposable gate 24 may be formed of any etchable material. For example, in one embodiment the disposable gate 24 is formed from a silicon polycrystalline (polysilicon) material. In another embodiment, the disposable gate 24 is formed from a silicon nitride material. Preferably, the disposable gate 24 is formed of a material such that the disposable gate 24 is readily removable with respect to the primary insulation layer 22. In other words, the etching process to remove the disposable gate 24 will readily remove material comprising the disposable gate 24 without substantially removing the material comprising the primary insulation layer 22.

Referring to FIG. 1B, an isolation dielectric layer 26 is formed outwardly from the primary insulation layer 22 such that a portion of the disposable gate 24 is exposed. The isolation dielectric layer 26 may be formed by depositing a layer of isolation dielectric material (not shown) over the primary insulation layer 22 and the disposable gate 24, said layer of isolation dielectric material having a thickness at least as great as the height of disposable gate 24 as measured from its base. The isolation dielectric layer 26 may be deposited by a Chemical Vapor Deposition (CVD) process, a Physical Vapor Deposition (PVD) process, such as sputtering, or other known means. Once formed, an upper portion of the layer of isolation dielectric material may then be removed such that the remaining thickness of isolation dielectric layer 26 is approximately the same as the height of gate 24 and at least a portion of the disposable gate 24 is exposed, as shown in FIG. 1B. Said removal may be accomplished by chemical mechanical polishing ("CMP"), resist etch-back ("REB"), a combination of the foregoing, or other known means. A post-CMP cleanup may done to remove any contaminants. The thickness of the isolation dielectric layer 26 is on the order of 0.2 microns.

The isolation dielectric layer 26 may comprise any suitable dielectric material such that a top surface 28 and a sidewall surface 29 of the isolation dielectric layer 26 are not readily etchable relative to the primary insulation layer 22, disposable gate 24, or substrate 12. In one embodiment, the top surface 28 and the sidewall surface 29 of the isolation dielectric layer 26 comprise a oxynitride material. In a particular embodiment, the isolation dielectric layer 26 is formed from silicon-rich oxynitride. It is preferable to use oxynitrides with a silicon content that is greater than the 46% associated with conventional silicon oxynitride. A higher silicon content helps to achieve a relatively low etch rate in comparison to $SiO_2$, for example, when using a wet etching process such as hydrofluoric acid ("HF"). Silicon-rich oxynitride is not a pure compound, but it can generally be represented by the $Si_xO_yN_z$ where, in terms of atomic percentages, x is approximately 53%±10%, y is approximately 38%±10%, and z is approximately 9%±10%.

The silicon-rich oxynitrides used in the present invention also have anti-reflective properties. For example, silicon-rich oxynitride has a refractive index ("RI") of 2.3 for light with a wavelength of 633 nanometers, and a RI of 1.98 for light with a wavelength of 248 nanometers. In comparison, the refractive index of conventional oxynitride (i.e., not silicon-rich) is typically in the range of 1.6–1.75.

One method to form a film of silicon-rich oxynitride is a deposition process that utilizes $SiH_4$ and $N_2O$ as reaction gasses, and He as a dilute gas to keep reactor pressure stable. In such a process, no ammonia ($NH_3$) is used. Other processes may also be used.

The oxynitride material forming the top surface 28 and the sidewall surface 29 of the isolation dielectric layer 26 may be thermally treated to vary the etch rate of the oxynitride relative to the etch rate of other materials, such as the material comprising the primary insulation layer 22. Table 1 below provides examples of some of the thermal treatments and etch rates that may be utilized with oxynitride. For example, in one embodiment the oxynitride material is annealed at 800° centigrade for 20 minutes. In this embodiment, the thickness of the oxynitride layer removed in a 4.9% HF solution for 60 seconds is reduced from 140 Å to 21 Å. In another embodiment, the oxynitride material is subjected to Rapid Thermal Annealing (RTA) at 1,000° centigrade for 15 seconds. In this embodiment, the thickness of the oxynitride layer removed in a hot phosphoric acid solution for 5 minutes is reduced from 245 Å to 30 Å. It will be understood that the oxynitride may be otherwise thermally treated without departing from the scope of the present invention.

TABLE 1

SAMPLE ETCH RATES

| | 4.9% HF for 60 Seconds | | | Hot Phosphoric Acid for 5 Minutes | |
|---|---|---|---|---|---|
| Material | Thermal Treatment | Total Etched (Å) | Material | Thermal Treatment | Total Etched (Å) |
| Silicon Dioxide | None | 284 | Silicon Nitride | None | 250 |
| Silicon Rich Oxynitride | None | 140 | Silicon Rich Oxynitride | None | 245 |
| Silicon Rich Oxynitride | 800° C. 20 Min. | 21 | Silicon Rich Oxynitride | 800° C. 20 min. | 30 |
| Silicon Rich Oxynitride | 1,000° C. 15 Sec. | 12 | Silicon Rich Oxynitride | 1,000° C. 15 sec. | 30 |
| Silicon Rich Oxynitride | 800° C., 20 Min. followed by 1,000° C., 15 Sec. | 35 | Silicon Rich Oxynitride | 800° C., 20 Min. followed by 1,000° C., 15 Sec. | 30 |

The selectivity of nitride to oxynitride can also be adjusted by modifying the etching solution. For example, using equal parts of hot phosphoric acid ($H_3PO_4$) and hydrofluoric acid (HF) in an etching solution significantly increases the selectivity of nitride to oxynitride. A selectivity of nitride to oxynitride of approximately 22:1 has been demonstrated using a solution comprising HF and $H_3PO_4$.

Referring to FIG. 1C, the disposable gate 24 is then removed. The disposable gate 24 is removed by selective etching while leaving substantially intact the isolation dielectric layer 26. The etching process used to remove gate 24 will depend upon the material which comprises said gate. In an embodiment in which the disposable gate 24 comprises a polysilicon material, the disposable gate 24 is removed by a choline wet etch process. In an embodiment in which the disposable gate comprises a nitride material, the disposable gate 24 is removed by a hot phosphoric acid process.

After the disposable gate 24 is removed, a portion of the primary insulation layer 22 is exposed, as shown in FIG. 1D. The exposed portion of the primary insulation layer 22 is then removed. The removal process to remove the primary insulation layer 22 is selective to the primary insulation layer 22 relative to the top surface 28 and the sidewall surface 29 of the isolation dielectric layer 26. In addition, the removal process to remove the primary insulation layer 22 is selective relative to the substrate 12. In other words, the removal process will readily remove the material comprising the primary insulation layer 22 without substantially removing the material comprising the top surface 28 and sidewall surface 29 of the isolation dielectric layer 26, or the substrate 12. Thus, the primary insulation layer 22 is removed to expose a portion of the substrate 12 without increasing the slot width 25 of the transistor.

In an embodiment in which the top surface 28 and sidewall surface 29 of the isolation dielectric layer 26 comprises oxynitride and the primary insulation layer 22 comprises silicon dioxide, the primary insulation layer 22 is removed by a 4.9% HF wet etch process detailed in Table 1 discussed previously. In an embodiment in which the top surface 28 of the isolation dielectric layer 26 comprises oxynitride and the primary insulation layer 22 comprises a nitride material, the primary insulation layer 22 of nitride is removed by a hot phosphoric acid wet etch in accordance with the processes also detailed in Table 1. As discussed previously, the oxynitride may be thermally treated to decrease the etch rate of the oxynitride while etching the primary insulation layer 22. It will be understood that the oxynitride isolation dielectric layer 26 may be otherwise etched or thermally treated without departing from the scope of the present invention.

Referring to FIG. 1E, a gate insulator 30 is formed on the exposed portion of the substrate 12. The gate insulator 30 forms an electrical insulator between the channel region 20 of the substrate 12 and various elements of the transistor. In one embodiment, the gate insulator comprises silicon dioxide on the order of 20 Å to 50 Å in thickness. The gate insulator 30 is grown on the substrate 12 by reacting oxygen with the exposed portion of the substrate 12. The reaction is carefully controlled in an environment such that the reaction forms substantially pure silicon dioxide having the requisite thickness. The thickness of the silicon dioxide may be varied to change the electrical insulating properties of the gate insulator 30. It will be understood that the gate insulator 30 may comprise other dielectric materials capable of electrically insulating microelectronic elements without departing from the scope of the present invention. For example, the gate insulator 30 may comprise a deposited insulator such as nitride or tantalum oxide, a nitride dielectric formed by means such as remote plasma nitridation or other conventional nitridation processes, or other suitable insulating material.

An alternative to growing a gate insulator 30 is to control the etching of primary insulation layer 22 in such a fashion as to leave behind a thin layer of material comprising the primary insulation layer 22 which thin layer will act as a gate insulator 30.

A disadvantage associated with conventional disposable gate MOSFET manufacturing techniques is that a significant loss in the isolation dielectric layer 26 occurs when the primary insulation layer 22 is removed by etching. Reducing the height of the isolation dielectric layer 26 degrades the quality of the semiconductor devices being formed because the gate to drain capacitance ("$C_{GD}$") and the gate to source capacitance ("$C_{GS}$") are increased. Said capacitances are increased if the thickness of the isolation dielectric layer 26 is reduced. The present invention adequately addresses this problem by utilizing an etch resistant material to comprise the dielectric layer 26. For example, silicon-rich oxynitride has a very low etch rate compared to the oxide material of the primary insulation layer 22, and as a result is much more resistant to the etch process. Therefore, the etching process to remove the primary insulation layer 22 leaves the isolation dielectric layer 26 substantially intact, and helps to prevent increases in $C_{GD}$ and $C_{GS}$.

Another disadvantage associated with conventional disposable gate MOSFET manufacturing techniques is that sidewalls are formed on the lateral edges of the disposable gate structure 24, in part to compensate for the expected loss in height of the isolation dielectric layer 26 and the expected increase in width of the slot once occupied by the disposable gate 24. The present invention does not utilize sidewalls because the isolation dielectric layer 26 is relatively unaffected by the etching process used to remove the disposable gate 24 and the primary insulation layer 22.

Another disadvantage associated with a loss in the height of the isolation dielectric layer 26 is that manufacturing process margins are significantly reduced. If all of the isolation dielectric layer 26 is removed at a point, the MOSFET structure being manufactured may be damaged during gate formation, and hence, have a total failure. By maintaining the integrity of isolation dielectric layer 26, manufacturing process margins are maintained.

Referring to FIG. 1F, a gate 32 is formed outwardly from the gate insulator 30. The gate 32 includes a gate contact surface 34 for connecting the gate 32 to the other microelectronic devices formed on the substrate 12. A contact surface width 36 is associated with the gate contact surface 34. In one embodiment, the gate 32 has the configuration of a T-gate. In this embodiment, the T-gate 32 is formed by photolithographic and pattern etching processes. In particular, a gate layer (not shown) is deposited by a CVD or PVD process. A typical thickness of the gate layer is approximately 0.1 microns. A photoresist material (not shown) is then applied over the gate layer and exposed to a pattern of light. The photoresist material is cured by the light and hardens to form a pattern of photoresist material. The patterned gate layer is then etched anisotropically such that the photoresist protects the gate material disposed under the photoresist material. The T-gate 32 is formed by that portion of the gate layer that is remaining after the anisotropic etch process.

Although a T-gate is illustrated in FIG. 1F, in another embodiment, the gate may be configured as a slot gate (not shown). In this embodiment, a gate layer (not shown) is deposited over the isolation dielectric layer 26 and the slot once occupied by disposable gate 24, as described above. The gate layer is then subjected to a Chemical-Mechanical Polish (CMP) process to remove the gate layer and expose the isolation dielectric layer 26. The remaining portion of the gate layer forms the slot gate. It will be understood that the gate 32 may be otherwise configured without departing from the scope of the present invention.

The gate 32 may comprise any suitable conducting material, or multiple layers of conducting materials. In one embodiment, the gate contact 32 comprises a metallic material such as platinum or aluminum. In another embodiment, the gate 32 comprises a polysilicon material that is sufficiently doped in situ, as it is deposited, so as to render it conductive. In yet another embodiment, the gate 32 comprises a titanium nitride layer covered by an aluminum layer. In yet another embodiment, the gate 32 comprises a polysilicon layer covered by a tungsten layer.

The disposable gate 24 allows the gate 32 to be fabricated with a smaller slot width 25 without sacrificing the contact surface width 36. This allows the transistor to be reduced in size while maintaining the size of the contact surface 34 for interconnecting other microelectronic devices.

Although the present invention has been described with several embodiments, various changes and modifications may be suggested to one skilled in the art. It is intended that the present invention encompass such changes and modifications that follow within the scope of the appended claims.

What is claimed is:

1. A gate structure comprising:
   a semiconductor substrate having a channel region;
   a gate insulator disposed over the channel region of the semiconductor substrate;
   a conductible gate disposed over the gate insulator;
   a primary insulation layer disposed over the semiconductor substrate, said primary insulation layer having an opening containing and abutting the gate insulator; and
   an isolation dielectric layer different from said gate insulator layer and formed of silicon-rich oxynitride having the formula $Si_xO_yN_z$, where x is about 53%±10%, y is about 38%±10% and z is about 9%±10%, having sidewalls and disposed over said substrate and having an opening to said gate insulator defined by said sidewalls; and
   said gate electrode disposed in said opening, contacting said gate insulator and extending along the sidewalls of said isolation dielectric.

2. The gate structure of claim 1, wherein said semiconductor substrate also has a first doped region and a second doped region, said regions formed on opposite sides of said channel region.

3. The gate structure of claim 1 wherein said isolation dielectric has a thickness at least as great as the height of the portion of a gate electrode within said sidewalls.

4. The gate structure of claim 2 wherein said isolation dielectric has a thickness at least as great as the height of the portion of a gate electrode within said sidewalls.

5. A gate structure for a semiconductor component, formed by the process of:
   forming a primary insulation layer adjacent a semiconductor substrate;
   forming a disposable gate having sidewalls and disposed on the primary insulation layer;
   forming a silicon-rich oxynitride layer over and in contact with the primary insulation layer and said sidewalls of said disposable gate, said silicon-rich oxynitride layer having the formula $Si_xO_yN_z$, where x is about 53%±10%, y is about 38%±10% and z is about 9%±10%, the disposable gate and primary insulation layer each being selectively removable relative to the silicon-rich oxynitride layer;
   removing an upper portion of the silicon-rich oxynitride layer which lies higher than the disposable gate, such that at least a portion of the disposable gate is exposed;
   removing the disposable gate to expose a portion of the primary insulation layer;
   removing the exposed portion of the primary insulation layer to expose a portion of the semiconductor substrate;

forming a gate insulator on the exposed portion of the semiconductor substrate; and forming a gate on the gate insulator.

6. The process of claim 5, further comprising the step of thermally treating the semiconductor component prior to removing the exposed portion of the primary insulation layer.

7. The process of claim 5, wherein the primary insulation layer is made of an oxide and wherein the step of removing the exposed portion of the primary insulation layer comprises the step of etching the exposed portion of the primary insulation layer with hydrofluoric acid to remove the exposed portion of the primary insulation layer.

8. The process of claim 5, the isolation dielectric having a depth toward said primary insulation layer which is greater than a depth of the disposable gate and extending to a height above said disposable gate.

9. The process of claim 6, the isolation dielectric having a depth toward said primary insulation layer which is greater than a depth of the disposable gate and extending to a height above said disposable gate.

10. The process of claim 7, the isolation dielectric having a depth toward said primary insulation layer which is greater than a depth of the disposable gate and extending to a height above said disposable gate.

\* \* \* \* \*